US007966424B2

(12) United States Patent
Abdo et al.

(10) Patent No.: US 7,966,424 B2
(45) Date of Patent: Jun. 21, 2011

(54) DATA COMPRESSION

(75) Inventors: Nadim Y. Abdo, Redmond, WA (US); Andrew Kadatch, Redmond, WA (US); Michael V. Sliger, Sammamish, WA (US)

(73) Assignee: Microsoft Corporation, Redmond, WA (US)

( * ) Notice: Subject to any disclaimer, the term of this patent is extended or adjusted under 35 U.S.C. 154(b) by 1532 days.

(21) Appl. No.: 10/801,329

(22) Filed: Mar. 15, 2004

(65) Prior Publication Data
US 2005/0210151 A1    Sep. 22, 2005

(51) Int. Cl.
*G06F 15/16*    (2006.01)
*H03M 7/40*    (2006.01)
(52) U.S. Cl. ............................ 709/247; 709/231; 341/65
(58) Field of Classification Search .................. 709/247, 709/231; 370/465; 341/50–52, 64–65
See application file for complete search history.

(56) References Cited

U.S. PATENT DOCUMENTS

| 4,730,348 | A | * | 3/1988 | MacCrisken | .................. 375/240 |
| 5,146,221 | A | * | 9/1992 | Whiting et al. | .................. 341/67 |
| 5,155,484 | A | * | 10/1992 | Chambers, IV | .................. 341/55 |
| 5,506,580 | A | | 4/1996 | Whiting et al. | |
| 5,968,132 | A | * | 10/1999 | Tokunaga et al. | ............. 709/247 |
| 2001/0038347 | A1 | * | 11/2001 | Avery et al. | ...................... 341/51 |
| 2002/0078241 | A1 | * | 6/2002 | Vidal et al. | .................... 709/247 |
| 2002/0138669 | A1 | | 9/2002 | Kadatch et al. | |
| 2004/0008896 | A1 | * | 1/2004 | Suzuki | .......................... 382/244 |

FOREIGN PATENT DOCUMENTS

| JP | 9036747 A | 2/1997 |
| JP | 9046235 A | 2/1997 |
| RU | 2192103 C2 | 10/2002 |
| RU | 2212112 C2 | 9/2003 |
| WO | WO9945709 A1 | 9/1999 |
| WO | WO0150612 A1 | 7/2001 |

OTHER PUBLICATIONS

Official Notice of Rejection for China Patent Application No. 200510009159.0 Mailed on Jul. 9, 2008 (43 pages).
Decision on Grant Patent for Invention from the Russian Federal Service for Intellectual Property, Patent Application No. 2005104018/09(005284), mailed on Jun. 25, 2009.
Salomon, "Data Compression", 1998, Springer, p. 104-110.
Saywood, "Introduction to Data Compression", 1996, pp. 100-105.
Uematsu, "Introduction to Document Data Compression Algorithm", CA Publishing, Ltd., Japan, Oct. 15, 1994, pp. 150-151.

* cited by examiner

*Primary Examiner* — William C Vaughn, Jr.
*Assistant Examiner* — Carlos R Perez Toro
(74) *Attorney, Agent, or Firm* — Lee & Hayes, PLLC

(57) ABSTRACT

Compression of streaming data is described. In an implementation, a method includes compressing data for communication in a terminal services environment by finding an index in a lookup table that matches an initial sequence in data. The lookup table includes a plurality of entries. Each of the entries is discoverable utilizing a particular one of a plurality of the indices. Each entry references whether a corresponding index is located in a history buffer, and if so, further references one or more locations of the corresponding index in the history buffer. If the corresponding entry of the matching index references a plurality of locations, for each location, a sequence having the matching index is compared with a sequence in the data that includes the initial sequence. A matching sequence is derived from the comparison based on a length and the location of the sequence at each of the locations. The matching sequence is represented using a representation that includes the length and the location of the matching sequence in the history buffer.

43 Claims, 9 Drawing Sheets

DATA COMPRESSION

TECHNICAL FIELD

The present invention generally relates to the field of data compression and more particularly to a system, server, method, and computer-readable media for data compression.

BACKGROUND

Users have access to increasing amounts of data in an ever increasing variety of ways. For example, a user may access a website and receive a broadcast of a concert event, i.e. a webcast. Additionally, a user may access games and other applications over a wireless network using a wireless phone. To provide this data to a user, data may be streamed from a server to a client over a network for rendering by the client. The user may then interact with the rendered data, such as by watching a movie, listening to a song, and so on.

Streaming data provides increased functionality to a user such that the user may quickly receive the data. Without streaming, if the entire amount of the data was needed to be received from a server before it was output by a client, the user may experience a delay in rendering the data at the client. By streaming the data, the delay encountered by the user may be lessened. Data streaming may be used to provide "real-time" rendering of data.

To stream data, data is transmitted from the server in a streaming or continuous fashion, generally using packets, for rendering at a client as the data arrives, as opposed to data that is not rendered until an entire file which includes the data is available at the client. Streaming may be used for a variety of types of data, such as video data, audio data, media data, and the like. A stream of video data provides a sequence of "moving images" that are transmitted and rendered when the images arrive. Likewise, a stream of audio data provides sound data that is played as the audio data arrives. A stream of media data includes both audio and video data.

Streaming data may be compressed to efficiently stream the data from the server over the network to the client and to increase the utility of the streamed data. For example, a network that communicatively couples the server to the client may have limited bandwidth. The limited bandwidth may limit the amount of data that may be communicated from the server to the client at any one time, and therefore the functionality provided to the client when streaming data over the network. For instance, video data that is streamed may be limited to lower resolutions due to limited bandwidth than would otherwise be the case if a higher-bandwidth network were utilized. Therefore, a user desiring higher resolution streaming video data may be forced to invest in a higher bandwidth connection. By compressing the streaming data, more data may be transferred over low-bandwidth networks at any one time and therefore improve the utility of the streamed data.

When compressing streaming data, however, additional complications may be encountered as opposed to compressing an entire set of data, e.g. block compressing. For example, to compress an entire movie at once, a compression routine may examine the entire amount of data that makes up the movie to compress the data. The compression routine may provide representations of common sequences that are included throughout the data that makes up the movie. Streaming data, however, may be provided for "real-time" rendering of the data. Therefore, there may be a limited amount of time to analyze streaming data to provide real-time rendering of the data by the client. Additionally, there may be a limited amount of data that is available for comparison at any one time to provide representations of common sequences.

Accordingly, there is a continuing need for data compression.

SUMMARY

Data compression is described. In an exemplary implementation, a compression module is executed by a server to compress data for streaming to a client, such as data sent in response to a request for remote access from a client, data in a terminal services environment, and so on. The compression module employs a history buffer that includes data that was previously streamed to the client. The compression module, when executed, compares a sequence in data to be streamed with one or more sequences in the history buffer to find a matching sequence. To locate the sequence in the history buffer, a lookup table is employed that has a plurality of entries that are each discoverable by one of a plurality of indices. Each of the entries references whether a corresponding index is located in the history buffer, and if so, further references one or more locations of the corresponding index in the history buffer. Therefore, the compression module may utilize an initial sequence in data to be streamed as an index in the lookup table to find a matching index in the history buffer. The matching sequence in the data may then be replaced with a representation that describes the location and the length of the matching sequence in the history buffer to form compressed data for streaming to the client.

In another implementation, a method includes receiving feedback that indicates availability of resources for communicating data over a network from a terminal service provided by a server to a client and tuning one or more parameters of a compression routine utilized to compress the data in response to the feedback.

In a further implementation, a method includes receiving a request at a server from a client for remote access to an application or a file that is available through the server. Availability of resources for communicating data in response to the request over a network is determined. One or more parameters of a compression routine utilized to compress the data are tuned based on the determined availability.

BRIEF DESCRIPTION OF THE DRAWINGS

The same reference numbers are utilized in instances in the discussion to reference like structures and components.

DETAILED DESCRIPTION

Overview

Data compression is described. In an exemplary implementation, a compression module is executed by a server to compress data for streaming from a server to a client. The compression module employs a history buffer that includes data that was previously streamed to the client. The compression module, when executed, compares a sequence in data to be streamed with one or more sequences in the history buffer to find a matching sequence. To locate the sequence in the history buffer, a lookup table is employed that has a plurality of entries. Each of the entries is discoverable utilizing a particular one of a plurality of indices. Each entry references whether a corresponding index is located in the history buffer, and if so, further references one or more locations of the corresponding index in the history buffer. Therefore, the compression module may utilize an initial sequence in data to be streamed as an index in the lookup table to find an entry. In this way, the compression module may quickly locate each location in the history buffer having the initial sequence without separately comparing each sequence in the history buffer for each sequence in the data to be streamed.

If the corresponding entry of the matching index references a plurality of locations, the compression module may then derive a matching sequence by comparing sequence at each location having the matching index with a sequence in the data that includes the initial sequence. The matching sequence in the data may then be represented with a representation that describes the location and the length of the matching sequence in the history buffer. Compressed data may then be formed which includes the representation. The compressed data is then streamed to the client. The client decompresses the compressed data by using a history buffer that also includes data that was previously streamed from the server to the client. The client, through execution of a decompression module, finds the matching sequence in the client's history buffer utilizing the length and the location indicated by the representation to reconstitute the data. In this way, a lossless data compression technique is provided such that data may be compressed and decompressed without loss of data. For example, video data may be compressed and decompressed utilizing this data compression technique without losing portions of the data, thereby preserving the resolution of the video data.

Exemplary Environment

Figure 1:
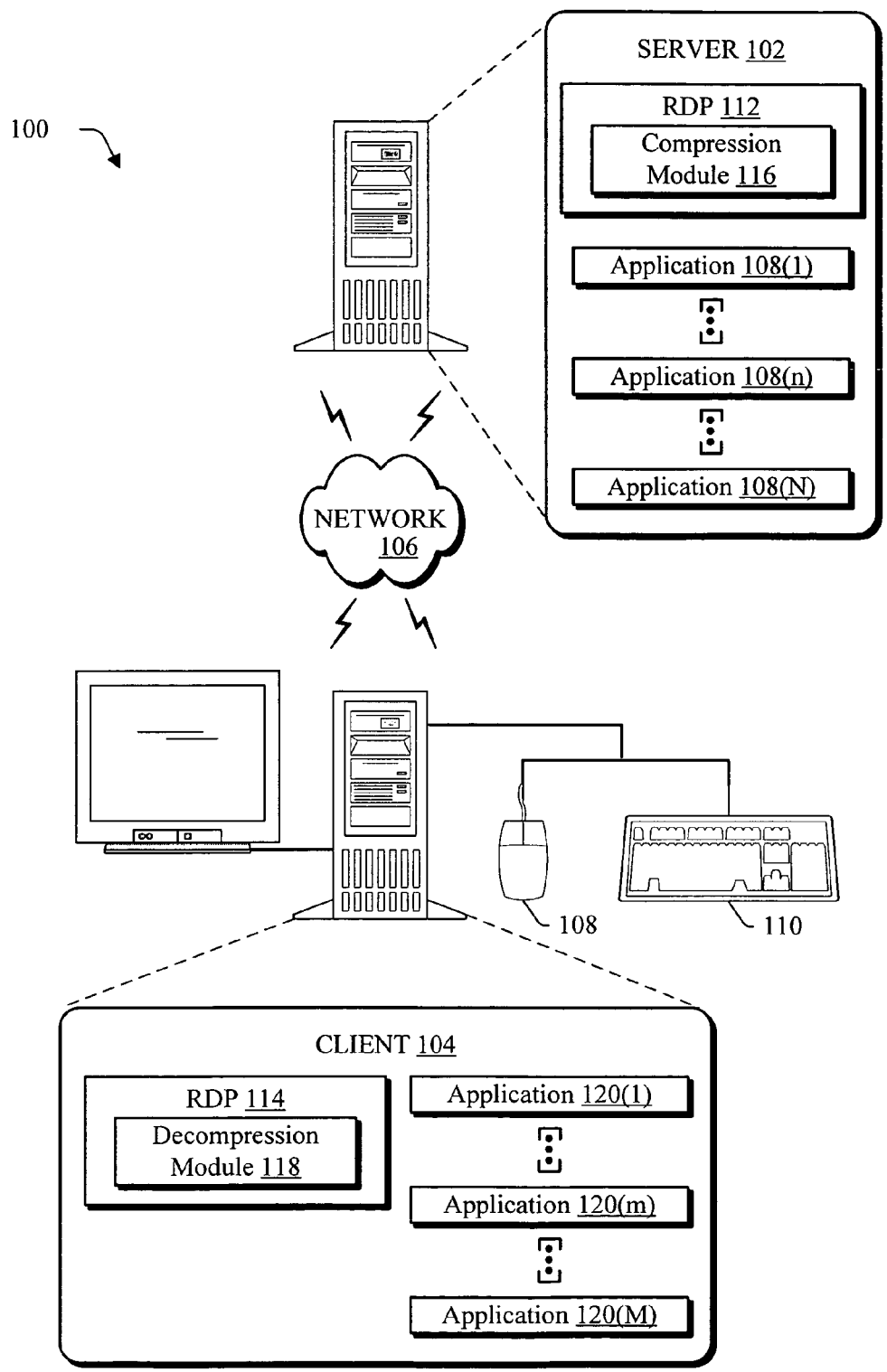
FIG. 1 is an illustration of an exemplary implementation showing an environment in data is streamed from a server to a client over a network.

FIG. 1 is an illustration of an exemplary implementation showing an environment 100 in which data is streamed from a server 102 to a client 104 over a network 106. The client 104 may be configured in a variety of ways. For example, the client 104 may be configured as a device that is capable of communicating over the network 106, such as a desktop computer as illustrated, a mobile station, an entertainment appliance, a set-top box, a wireless phone, and so forth. The client 104 may also relate to a person and/or entity that operates the client 104. In other words, client 104 may describe a logical client that includes a user and/or a machine. Although one client 104 is illustrated, a plurality of clients may be communicatively coupled to the network 106. The network 106 is illustrated as the Internet, and may also include a variety of other networks, such as an intranet, a wired or wireless telephone network, and so forth.

The server 102 is configured to stream data over the network 106 to the client 104. The server 102 may provide a variety of streaming data for rendering by the client 104. In one implementation, the server 102 may provide a webcast of a concert that is streamed to the client 104. When rendered by the client 104, a user may view and listen to the webcast. In another implementation, the client 104 may receive data that includes a song that is streamed from the server 102 for output by the client 104.

In a further implementation, the server 102 may also provide terminal services for remote application execution. For example, the server 102 may include a plurality of applications 108(1), ..., 108(n), ..., 108(N), in which "n" can be any application from 2 to "N". Each of the applications 108(1)-108(N) is executed on the server 102. The server 102 streams screen information to the client 104 over the network 106 that is provided through execution of the applications 108(1)-108(N). For example, the screen information may include a display of a desktop provided by an operating system and a window that displays information related to the execution of a word processor, as well as audio information that is provided by the operating system and/or word processor.

The screen information that is streamed from the server 102 is rendered by the client 104 for viewing by the user. The user may interact with the client 104 to provide inputs utilizing input devices of the client 104, such as a mouse 108 and/or keyboard 110. The inputs may correspond to the rendered screen information, such as a textual input for the word processor that is provided by utilizing the keyboard 110. The inputs are communicated from the client 104 to the server 102 over the network 106. The inputs, when received by the server 102, may be utilized in the execution of the plurality of applications 108(1)-108(N). For example, the word processor may receive textual inputs for inclusion in a document, and stream screen information to the client 104 to illustrate the document having the included text. Through execution of the applications 108(1)-108(N) on the server 102 and the streaming of screen information to the client 104, the client 104 may access functionality that might not otherwise be available on the client 104, itself.

The client 104, for example, may be configured as a "thin" client, such as having limited processing and/or memory resources. The server 102, however, may be feature rich, such as by having a greater amount of processing and/or memory resources than the client 104. Therefore, the server 102 may execute applications that may not be executed by the client 104 and/or that are executed by the client 104 in a slower manner. The server 102 provides results of the execution of one or more of the applications 108(1)-108(N) to the client 104 by sending screen information to the client 104 and receives inputs from the client 104 over the network 106. In this way, the functionality provided by the server 102, such as processing resources, memory resources, and the plurality of applications 108(1)-108(N) may be provided to a client 104 that otherwise would not have access to this functionality.

To provide communication between the server 102 and the client 104 over the network, the server 102 and the client 104 may implement, respectively, a remote desktop protocol (RDP) 112, 114. RDP 112, 114 is designed to provide remote display and input capabilities over network connections for applications 108(1)-108(N) as previously described. RDP, for instance, may be utilized to allow for separate virtual channels that carry device communication and presentation data from the server 102 to the client 104, as well as encrypted inputs that are communicated from the client 104 to the server 102.

The RDPs 112, 114 may also provide bandwidth reduction by including compression and decompression modules 116, 118 on the server 102 and client 104, respectively. The compression module 116 may be executed by the server 102 through implementation of the RDP 112 to compress data before it is streamed over the network 106. Likewise, the decompression module 118 may be executed by the client 104 through implementation of the RDP 114 to decompress the compressed data that was streamed over the network 106 from the server 102.

The compression and decompression modules 116, 118, when executed, respectively compress and decompress data that is streamed over the network 106. As previously stated, compression and decompression of streaming data may result in unique complications, as opposed to compression and decompression of an entire set of data at one time, i.e. block compression. For example, data may be streamed in "real-time" such that delays encountered in the streaming of the data may reduce the usefulness of the data. The compression and decompression modules 116, 118 address the unique complications of streaming data, and thereby provide for the streaming of compressed data over the network 106, as is described in greater detail in relation to FIGS. 3 through 5.

By using terminal services (TSs) the client 104 may access one of more of the applications 108(1)-108(N) installed on the server 102, execute the application on the server 102, and display the applications' user interface (UI) on the client 104. Since the applications 108(1)-108(N) are executed on the server 102, TSs allow the client 104 to take advantage of corporate infrastructure resources independent of whether the client 104 has appropriate hardware and software to execute the resources locally on the client 104 itself.

Although the client 104 is described in a terminal services environment in which the plurality of applications 108(1)-108(N) are executed by the server 102, the client 104 may also execute one or more of a plurality of applications 120(1), . . . , 120(m), . . . , 120(M). For example, one of the applications 120(1)-120(M) may provide an interface that is utilized in conjunction with the RDP 114 to render data for viewing by a user and to receive inputs from the user, such as from the mouse 108 and/or keyboard 110. Additionally, although the compression and decompression modules 116, 118 are illustrated as being a part of the respective RDPs 112, 114, the compression and decompression modules 116, 118 may be configured as stand-alone software components that are executed to compress and decompress streaming data, respectively.

Additionally, although portions of the following discussion describe use of compression in a terminal services environment, the compression and decompression techniques described herein may also be utilized in a variety of other environments. For example, the compression techniques may be utilized to compress data used in a remote access environment. Remote access describes the ability to access a computer or a network from a remote distance. For example, a remote office of a corporation may desire access to the corporation's network and utilize remote access to gain access to files and applications contained therein, such as over a telephone network, the Internet, and so on. The server 102 may be configured as a remote access server having associated software that is set up to handle clients seeking access to network remotely. In an implementation, the remote access server includes a firewall server for security and a router that for forwarding remote access requests to other parts of the network. A remote access server may also be used as part of a virtual private network (VPN).

Figure 2:
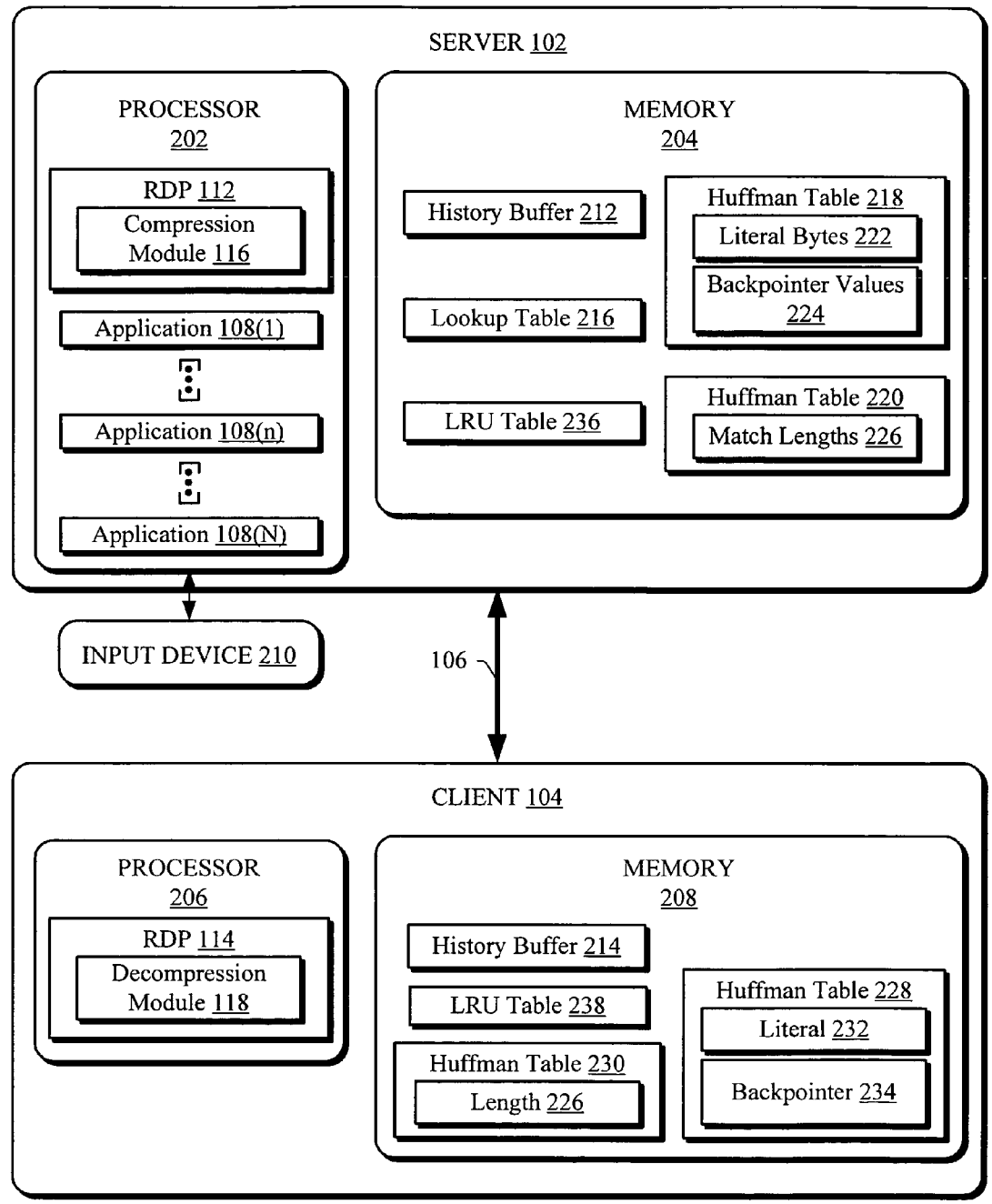
FIG. 2 is an illustration of an exemplary implementation showing the server and the client of FIG. 1 in greater detail.

FIG. 2 is an illustration of an exemplary implementation 200 showing the server 102 and the client 104 of FIG. 1 in greater detail. The server 102 includes a processor 202 and memory 204. The RDP 112 and its respective compression module 116 are illustrated as being executed on the processor 202 and are storable in computer-readable storage media. such as the memory 204. Likewise, the client 104 includes a processor 206 and memory 208. The RDP 114 and its respective decompression module 118 are illustrated as being executed on the processor 206 and are storable in computer-readable storage media. such as the memory 208.

Data that is to be streamed from the server 102 to the client 104 may be provided from a variety of sources, such as execution of one or more of the applications 108(1)-108(N), received from an input device 210, such as a video camera, microphone, and so on. The compression module 116 is executed on the processor 202 of the server 102 to compress data for streaming to the client 104. The data may be streamed from the server 102 to the client 104 in packets.

The compression module 116, for example, may receive data having an uncompressed sequence of a given length and attempt to compress that sequence down to a smaller (now compressed) length, e.g. having fewer bytes, bits, and so on. The compression module 116 may compress the data on a per-packet basis by replacing a sequence with a representation that uses less memory resources when stored, e.g. fewer bytes, than the sequence that was replaced.

If the compression module 116 is able to compress the sequence, compressed data is sent to an endpoint of an RDP connection, i.e. RDP 114 of the client 104. The decompression module 118 is executed by the client 104 to decompress the compressed data to reconstitute the data. In the event that the compression module 116 is unable to compress the data, the data may be streamed to the client 104 in an uncompressed form, i.e. a literal sequence. The compression module 116 may then be executed by the server 102 to attempt compression of a subsequent sequence.

The basic operation used to compress data involves pattern matching of sequences in the data to be compressed with sequences that have been streamed in the past. To accomplish this, the compression module 116 maintains a history buffer 212 that contains data that was previously streamed to the client 104. The compression module 116, when executed, matches a sequence in data to be streamed with one or more sequences that are included in data that was already streamed to the client 104. Sequences in the data to be streamed that match sequences in the history buffer may then be represented through the use of one or more representations that reference the matching sequence in the history buffer 212. The representations may be smaller, i.e. utilizing less memory resources, than memory resources used to store the actual sequence to be compressed, i.e. the matching sequence. This effectively reduces the amount of data that is included in the streamed data.

To illustrate a basic example of pattern matching using the history buffer 212, suppose that the history buffer 212 contains the following sequence:

1 2 7 4 5 6 3 9 4 5 1 4 9 1

The compression module 116 is executed on the processor 202 of the server 102 and receives the following sequence:

4 5 9 7 4 5 6 3 9 4 5 1 4 6

The compression module 116, when executed, finds the longest sequence in the history buffer that matches a sequence in the data to be compressed, i.e. a matching sequence. In this case, the matching sequence that appears in the history buffer is shown in bold below. The matching sequence is ten bytes long and starts three bytes from the beginning of the history buffer 212 (starting at the left and counting from zero).

4 5 9 7 4 5 6 3 9 4 5 1 4 5

Thus, the compression module 116, when executed, may produce compressed data by representing the data to be streamed as follows:

4 5 9 (match of length 10 bytes starting 3 bytes from the beginning of the buffer) 6

By referencing a matching sequence in the history buffer, the server 102 does not need to re-send sequences that have already been streamed to the client 104. Thus, the compression module 116 compresses data to be streamed by finding repeated patterns in data that is to be streamed and replacing the repeated patterns, i.e. matching sequences, with a representation that uses less memory resources and bandwidth when transmitted over the network 106.

To decompress the compressed data, the client 104 includes a decompression module 118 and a history buffer 214. The history buffer 214 of the client 104, like the history buffer 212 of the server 102, stores previously streamed data. Therefore, the decompression module 118, when executed by the client 104, may decompress compressed data that was streamed to the client 104 by using the history buffer 214. Continuing with the previous example, suppose the client 104 receives the compressed data which is shown as follows:

4 5 9 (match of length 10 bytes starting 3 bytes from the beginning of the buffer) 6

Based on the representation included in the compressed data, the decompression module 118, when executed, may retrieve the compressed sequence from the history buffer 214, which is shown in bold as follows:

4 5 9 7 4 5 6 3 9 4 5 1 4 6

Thus, the decompression module 118 may decompress the compressed string through use of the history buffer 214.

The server 102 may also include a lookup table 216 to find matching sequences in the history buffer 212. For example, the lookup table 216 may include a plurality of entries that are each discoverable by a corresponding one of a plurality of indices. Each entry describes each location in the history buffer 212 having the corresponding index. Thus, the compression module 116, when executed by the server 102, may utilize the lookup table 216 to quickly locate a particular sequence in the history buffer 212. Further discussion of the lookup table 216 and the history buffer 212 may be found in relation to FIGS. 3-4.

The server 102 may also utilize encoding techniques to further compress data for streaming, such as Huffman encoding, arithmetic encoding, prefix encoding, and Markov encoding. For example, data to be streamed may include sequences which do not match sequences in the history buffer. These sequences may be referred to as "literal" sequences. By utilizing Huffman encoding, some or all of the literal sequences in the data may be compressed to further compress the data. For instance, Huffman encoding may start with a frequency of occurrences table that relates a frequency of occurrence of each literal sequence that is to be further compressed. The frequency of occurrences table may be generated from the data itself and/or representative data. For instance, the frequency of occurrences of the literal sequences may be obtained by processing previously streamed packets and then utilized to process each subsequent packet.

A variable length string, for example, may be assigned to each literal sequence that uniquely represents that particular literal sequence, such as a unique prefix. The variable length strings are then arranged as a tree to encode and decode each literal sequence and representation, respectively. To encode a literal sequence, the literal sequence to be encoded is located in the tree. Branches of the tree that are utilized to locate the leaf that includes the literal sequence are utilized to encode the literal sequence, i.e. provide a representation of the literal sequence. For example, each branch of a tree utilized for Huffman encoding may be marked by a symbol of an output alphabet, e.g. bits 0 and 1, so that encoding is an enumeration of branch markings on a path from a root of the tree to the literal sequence being encoded. Decoding each representation is performed by traversing the tree from its origin down through the branches to the leaf of the tree based on each successive value in the variable length string until a leaf of the tree is reached that includes the literal sequence.

Although Huffman encoding of literal sequences has been described, Huffman encoding may be utilized to further compress a variety of data. For example, Huffman table 218 may encode both literal 222 sequences and backpointers 224. Literal sequences, as previously described, include sequences that are not found in the history buffer 212. Therefore, through use of the Huffman table 218, the literal 222 sequences may be compressed. Huffman table 218 may also be utilized to compress a backpointer 224. The backpointer 224 describes a location of a particular sequence in the history buffer 212. For example, as previously described, a sequence in data that matches a sequence in the history buffer 212, i.e. a matching sequence, may be described as a "match of length X bytes starting at Y bytes from the beginning of the buffer". The backpointer 224 describes the location of the matching sequence in the history buffer 212, i.e. Y bytes. Huffman table 220 may be utilized to compress the length 226, i.e. X bytes, of the matching sequence.

To decompress compressed data that is streamed from the server 102 to the client 104, the decompression module 116 is executed by the client 104 utilizing Huffman tables 228, 230 that correspond, respectively, to the Huffman tables 218, 220 of the server 102. For example, Huffman table 228 may be utilized to decompress literal 232 sequences and a backpointer 234, while Huffman table 230 may be utilized to decompress a length 226 of the matching sequence. Further discussion of Huffman tables may be found in relation to FIG. 7.

The server 102 and the client 104 may also include respective last recently used (LRU) tables 236, 238. Each of the LRU tables 236, 238 may be utilized to further encode backpointers based on whether the backpointer was one of the "last recently used" backpointers. For example, LRU table 236 may be utilized to provide a LRU representation, respectively, for each of the last four backpointers. The LRU representation is used as an index to locate a particular backpointer in the LRU table 236. In this way, backpointers which are repeated may be further compressed. Further discussion of LRU tables may be found in relation to FIG. 7.

Although compression of data that is streamed from the server 102 to the client 104 is described, the client 104 may also compress and stream data back to the server 102. Additionally, although the following discussion describes compression of data in relation to packets that are streamed from the server 102 to the client 104, a variety of collections of data may be utilized to compress data, such as sub-packet byte sequences, multiple packets, and so on. Further, although the following discussion describes byte sequences, other sequences in data are also contemplated, such as bits.

Exemplary Procedures

Figure 3:
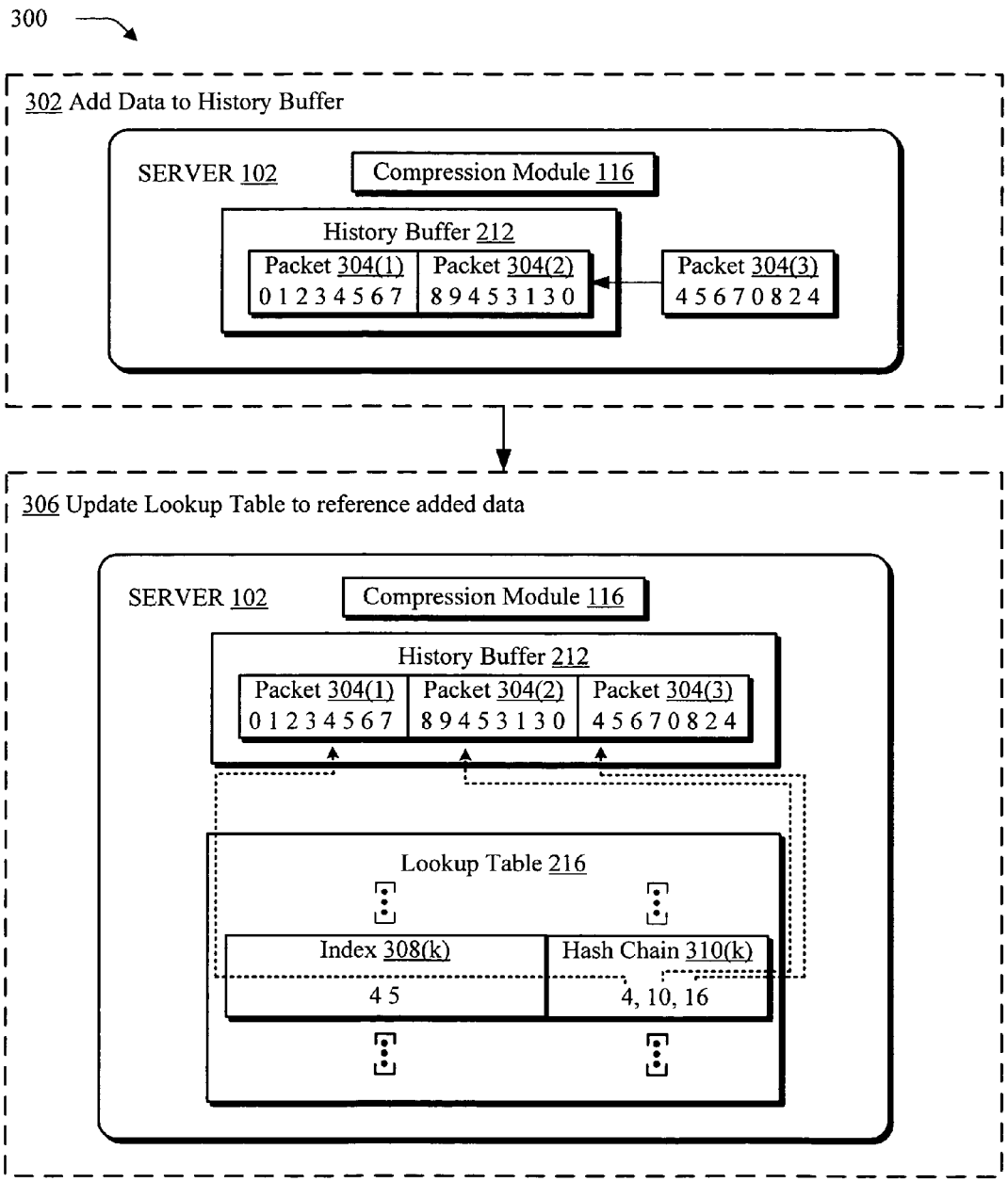
FIG. 3 is a flow chart that depicts an exemplary procedure in which data for streaming is configured for compression.

FIG. 3 is a flow chart that depicts an exemplary procedure 300 in which data for streaming is configured for compression. At block 302, data is added to the history buffer 212. For example, the history buffer 212 may include a plurality of packets 304(1), 304(2) that were streamed and/or are ready to be streamed from the server 102 to the client 104 of FIG. 2 over the network 106. In another implementation, the packets 304(1), 304(2) may correspond to data that was previously processed through execution of the compression module 116.

The server 102 receives a packet 304(3) that is to be streamed. The compression module 116, when executed by the server 102, adds the packet 304(3) to the history buffer 212 such that the history buffer includes the packets 304(1), 304(2) that were streamed and packet 304(3) that is to be streamed.

At block 306, the compression module 116, when executed by the server 102, updates the lookup table 216 to reference the added data, i.e. packet 304(3). The lookup table 16 is configured to include a plurality of indices 308(k), where "k" can be any index from "1" to "K". Each of the indices 308(k) is utilized to discover a respective one of a plurality of entries in the lookup table 216. Each entry references whether a corresponding one of the plurality of indices 308(k) is located in the history buffer 212, and if so, one or more locations of the corresponding index 308(k) in the history buffer 212. For example, one of the plurality entries may reference a plurality of locations in the history buffer 212 that have the corresponding one of the indices 308(k). Each of the plurality of locations is illustrated as being described through use of a corresponding one of a plurality of hash chains 310(k).

Index 308(k), for instance, is illustrated as having a sequence of "4 5". The corresponding entry for the index 308(k), i.e. hash chain 310(k), in the lookup table 216 describes each location of the index 308(k) "4 5" in the history buffer 212. For example, packet 304(1) is illustrated in FIG. 3 as having the following sequence:

0 1 2 3 4 5 6 7

Packet 304(2) is illustrated in FIG. 3 as having the following sequence:

8 9 4 5 3 1 3 0

Packet 304(3), which is to be streamed to the client 104 of FIG. 2, is illustrated in FIG. 3 as having the following sequence:

4 5 6 7 0 8 2 4

The packets 304(1)-304(3) may be sequentially arranged in the history buffer such that the following sequence is observed:

0 1 2 3 4 5 6 7 8 9 4 5 3 1 3 0 4 5 6 7 0 8 2 4

The hash chain 310(k) describes each location of the index 308(k) "4 5" in the history buffer 212. Each of the locations may be described in a variety of ways. For example, the locations may be described as a location of a first byte of the sequence when counting from the beginning of the history buffer 212, starting with the number zero. Hash chain 310(k) describes a first location of the index 308(k) "4 5" at 16 bytes from the beginning of the sequence in the history buffer 212, as shown by a dashed line in FIG. 3 from "16" in hash chain 310(k) to the beginning of packet 304(3). Likewise, hash chain 310(k) describes a second location of the index 308(k) "4 5" at ten bytes from the beginning of the sequence in the history buffer 212, which is illustrated by a dashed line in FIG. 3 from "10" from hash chain 310(k) to the third byte of packet 304(2). Further, hash chain 310(k) includes a third and final location of the index 308(k) "4 5" at 4 bytes in the history buffer 212. Thus, the lookup table 216 includes an index 308(k), e.g. "4 5", having a corresponding entry that references a hash chain 310(k) that describes each location, e.g. 4, 10, 16, of the index 308(k) in the history buffer 212. By updating the lookup table 216, the compression module 116, when executed, may compress the data to be streamed in a more efficient manner, as will be described in greater detail in relation to FIG. 4.

Although each index 308(k) is illustrated in FIG. 3 as having a corresponding one of the plurality of hash chains 310(k), there may be instances in which an index 308(k) does not have a corresponding hash chain. For example, in some instances the history buffer 212 may not include the index. Therefore, an entry in the lookup table 216 that corresponds to that index may not include a hash chain. In other words, the hash chain for that index has a value of zero, i.e. there is no location in the history buffer 212 that includes the corresponding index. Additionally, although each of the plurality of hash chains 310(k) is illustrated as included in the lookup table 216, one or more of the hash chains 310(k) may be provided in a variety of ways. For instance, each entry in the lookup table 216 may include a pointer to a corresponding hash chain which is configured as an array that is separate from the lookup table 216.

Figure 4:
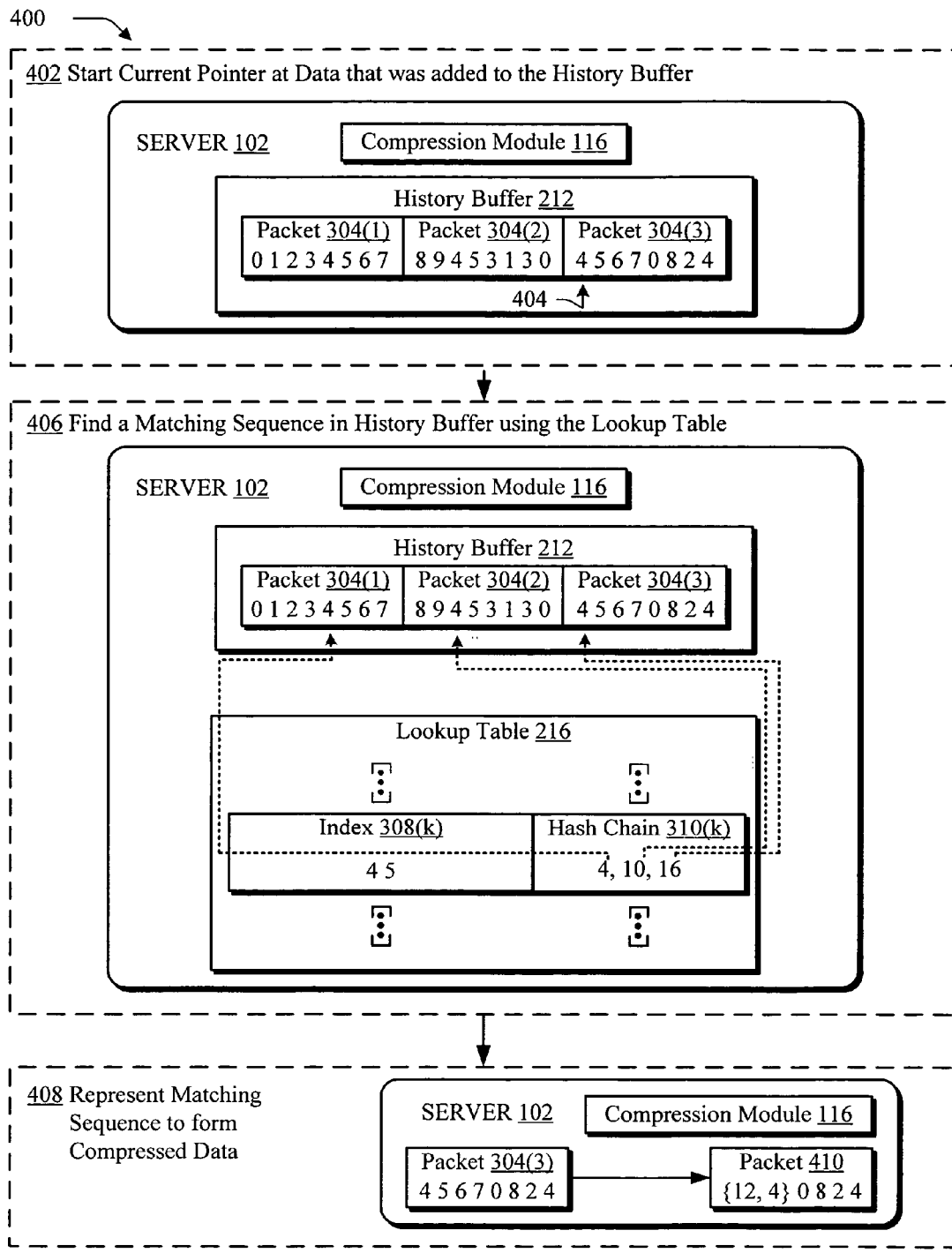
FIG. 4 is a flow chart depicting an exemplary procedure in which a lookup table of FIG. 3 that is configured to include references to a packet to be streamed is utilized to compress the packet.

FIG. 4 is a flow chart depicting an exemplary procedure 400 in which the lookup table 216 of FIG. 3 that is configured to include references to the packet 304(3) to be streamed is utilized to compress the packet 304(3). At block 402, the compression module 116, when executed, starts a current pointer 404 at data which was added, i.e. packet 304(3), to the history buffer 212 at block 302 of FIG. 3.

At block 406, the compression module 116 is executed by the server 102 to find an index in the lookup table 216 that matches an initial sequence at the current pointer 404. For example, the compression module 116 may utilize an initial sequence that is composed of two bytes, e.g. "4 5", at the current pointer 404 to find one of a plurality of indices 308(k) that match the initial sequence. In this example, index 308(k) "4 5" of the lookup table 216 matches the initial sequence "4 5" at the current pointer 404 in the history buffer 212. The index 308(k) has a corresponding entry in the lookup table 216 that references the hash chain 310(k) that describes each location of the index "4 5" 308(k) in the history buffer 212. Therefore, the corresponding entry describes each location of the initial sequence in the history buffer 212.

If the corresponding entry of the matching index 308(k) references a plurality of locations, a sequence at each location in the history buffer 212 having the matching index 308(k) "4 5" is compared with a sequence in the data having the initial sequence at the current pointer 404. For example, the initial sequence "4 5" at current pointer 404, i.e. location "16" in the history buffer 212, and a sequence at location "10" in the history buffer 212 has a length of "2", i.e. only the first two bytes in the byte sequence at each location match, one to another. As previously stated, the locations in the hash chain 310(k) in this example are described by counting from the beginning of the history buffer 212, starting with the number zero. The initial sequence at current pointer 404 and a sequence at location "4" in the history buffer 212 have a length of "4". In other words, four bytes in the byte sequence at location "4" match four bytes in the sequence at location "4". In this way, a matching sequence "4 5 6 7" is derived from the computed length. To find an optimal matching sequence, each location in the hash chain 310(k) may be compared with the sequence of the data to be compressed, i.e. packet 304(3), until a maximum length is computed and/or a threshold is reached, as is described in greater detail in relation to FIG. 7. To optimize the comparison, a next byte is the sequence, e.g. a byte that follows the initial sequence or the index in the history buffer 212, may be compared first, since it is known from the matching that the first two bytes match. Additional discussion of comparison based on "next" byte in the sequence may be found in relation of FIG. 8.

At block 408, the matching sequence is represented with a representation that is used to form compressed data. For example, the matching sequence "4 5 6 7" in packet 304(3) may be represented with a representation that describes the length of the matching sequence and the location of the matching sequence in the history buffer 212. The representation may be formatted as a tuple, i.e. a collection having a specified order, which is formatted as {backpointer, length}. Backpointer may describe a relative location of the matching sequence as an offset in the history buffer 212. For example, the backpointer may describe the relative location as an offset between the absolute location of the matching sequence and the absolute location of the current pointer 404 in the history buffer 212. In this example, the absolute location of the matching sequence is at position 4 in the history buffer 212 and the absolute location of the current pointer 404 is "16". Therefore, the relative location of the matching sequence is 12 bytes from the current pointer 404. Length describes the length of the matching sequence, e.g. "4". Thus, packet 304(3) may be compressed by representing the matching sequence "4 5 6 7" with a representation "{12, 4}" to form compressed data, e.g. packet 410. In another implementation, the location of the matching sequence may be provided from the absolute location of the matching sequence in the history buffer, e.g. location 4.

The lookup table 216 may thus provide each location of each index 308(k) in the history buffer 212. Therefore, when the compression module 116 is executed, each location of an initial sequence may be found in the history buffer 212 without "walking" each individual bit or byte in the history buffer 212 to find a matching sequence. Thus, the compression module 116 may efficiently compress data to be streamed.

Figure 5:
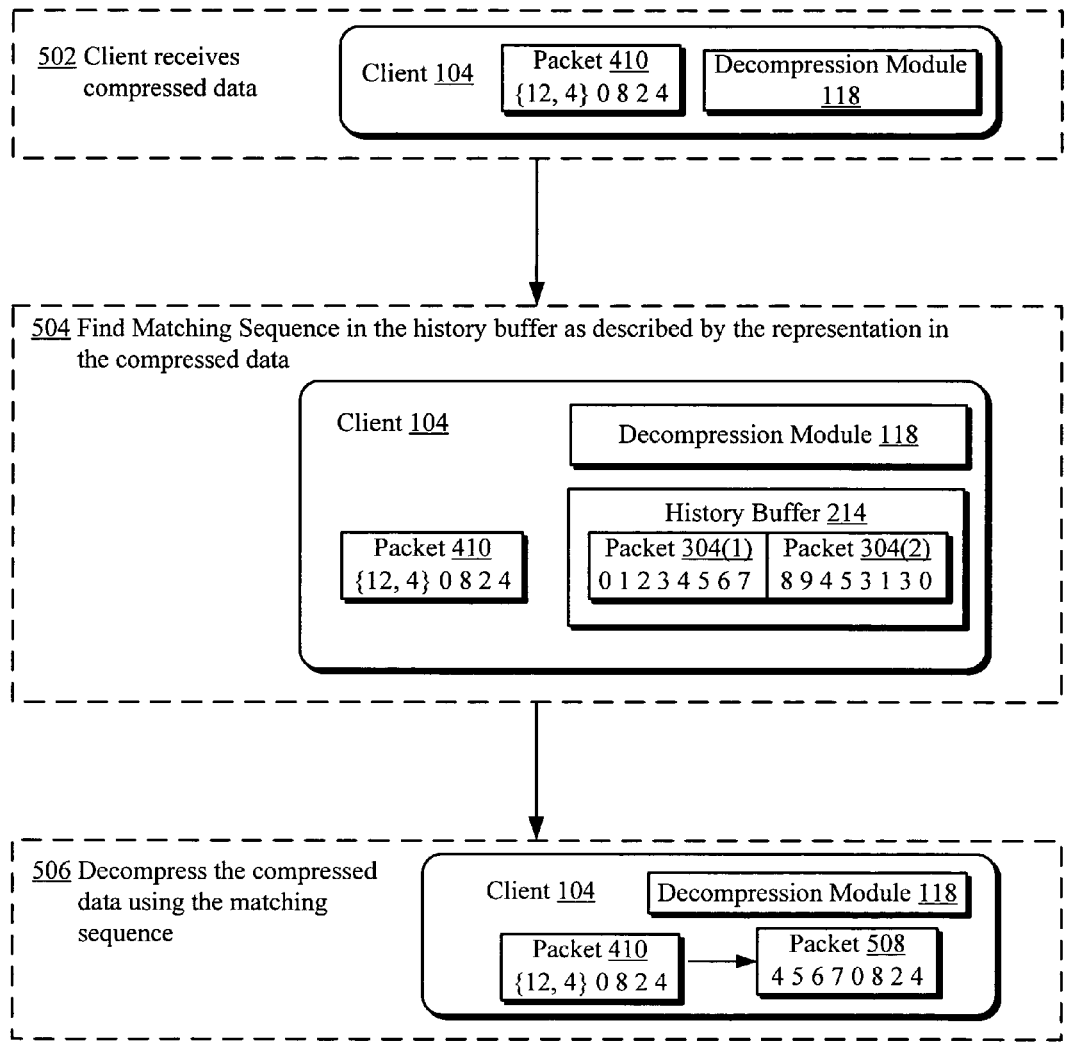
FIG. 5 is a flow chart depicting a procedure in an exemplary implementation in which a compressed packet of FIG. 4 is decompressed by the client through execution of a decompression module.

FIG. 5 is a flow chart depicting a procedure 500 in an exemplary implementation in which compressed data of FIG. 4 is decompressed by the client 104 through execution of the decompression module 128. At block 502, the client 104 receives compressed data, e.g. packet 410, which was streamed to the client 104 from the server 102 of FIG. 4.

At block 504, the decompression module 128, when executed, finds the matching sequence in the history buffer 214 of the client 104. The history buffer 214 of the client 104, like the history buffer 212 of the server 102, may include data that was streamed from the server 102 to the client 104. Thus, the history buffer 214 of the client 104 matches the history buffer 212 of the server 102 before the compressed data, e.g. packet 410, was formed. Therefore, the decompression module 118, when executed, may find the matching sequence in the history buffer 214 of the client 104 from the representation that describes the length and the location of the matching sequence in the history buffer 212 of the server. Continuing with the previous example, the matching sequence "4 5 6 7" is found at location "12" which is a relative location as previously described.

At block 506, the decompression module 118, when executed, replaces the representation with the matching sequence to reconstitute the data. For example, representation "{12, 4}" is replaced by the matching byte sequence "4 5 6 7" to form packet 508 which includes the sequence "4 5 6 7 0 8 2 4" which matches the sequence of packet 304(3) that was compressed at block 408 of FIG. 4. For instance, compressed data may be formed from the data to be streamed by forming a new set of data that includes the representation in place of the matching sequence. Thus, as shown in this example, the client 104 may decompress the compressed data without using the lookup table 216. Therefore, the compressed data that is streamed may be decompressed by the client 104 even when the client 104 has reduced hardware and/or software resources when compared with the server 102.

In the exemplary procedures 300, 400 which were described, respectively, in relation to FIGS. 3-4, the lookup table 216 was configured such that each of the plurality of indices 308(k) includes two-bytes. Therefore, the lookup table 216 may be provided with 65,536 corresponding entries that described every two byte sequence in the host buffer 212. This enables the initial sequence to be used directly in the lookup table 216. In other words, the initial sequence is not converted for use with the lookup table 216 to discover a corresponding entry. Although indices 308(k) having two bytes are described, a variety of different index lengths may be utilized, such as three byte sequences, four byte sequences, and so on.

Figure 6:
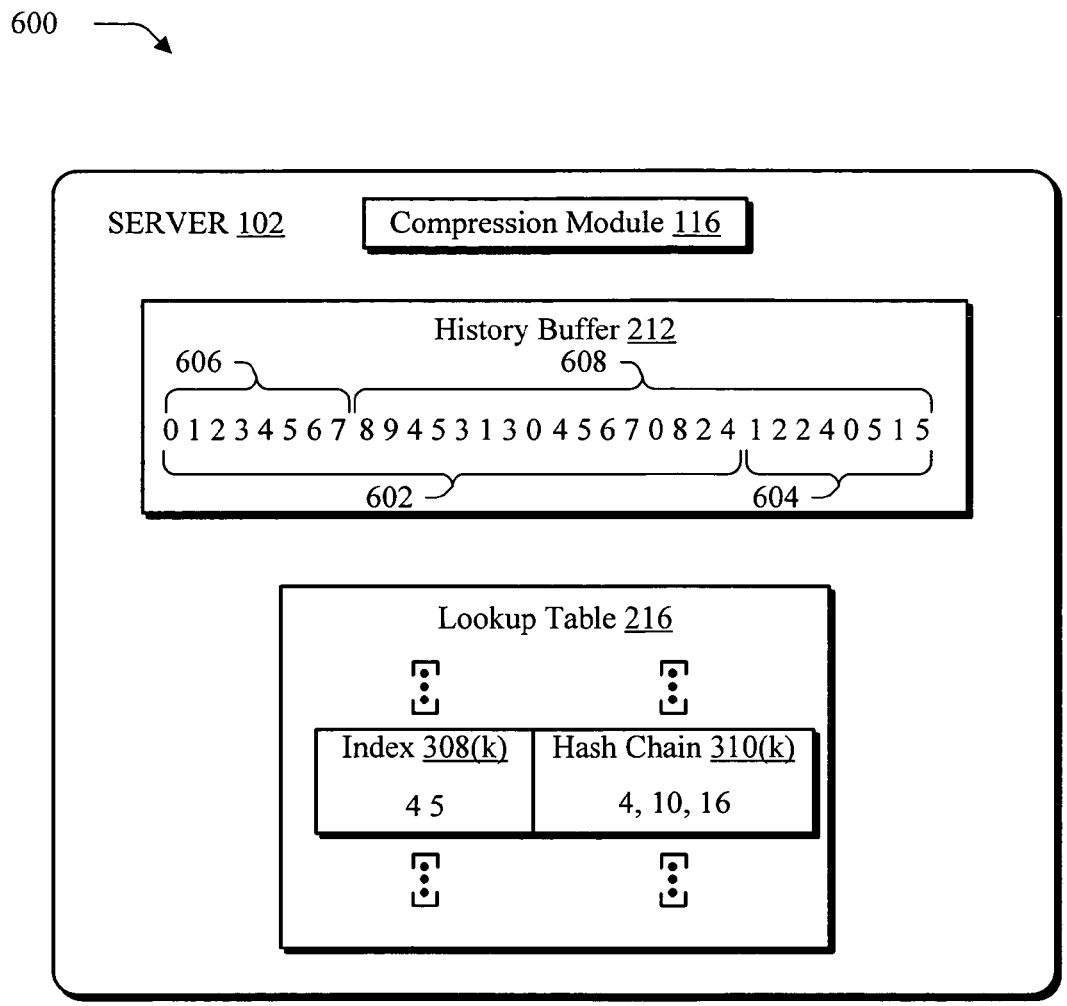
FIG. 6 is an illustration of an exemplary implementation in which a sliding window is utilized in a history buffer to include data to be streamed.

FIG. 6 is an illustration of an exemplary implementation 600 in which a sliding window is utilized in the history buffer 212 to include data to be streamed. In the implementation discussed in relation to FIG. 3, the packet 304(3) was added to the history buffer 212. The lookup table 216 was then updated to reference the packet 304(3). The history buffer 212, however, may have a limited amount of storage. Therefore, a sliding window is employed to include newly added data in the history buffer 212.

The history buffer 212, for example, may include a sequence 602 as a result of adding packet 304(3) at block 302 of FIG. 3. The history buffer 212 in this example may store a maximum of 24 bytes. Therefore, to add a sequence 604 having eight bytes, the compression module 116 is executed to remove a sequence 606 having eight bytes from the beginning of the history buffer 212 and moves the remaining sequence to the beginning of the history buffer 212. The new sequence 604 is then added at the end of the history buffer 212. By moving and adding sequences, the history buffer 212 then has a sequence 608 having 24 bytes that includes the newly added sequence 604.

To update the lookup table 216 to reflect the sequence 608, each location in the hash chains 310(k) in the lookup table 216 may have a number subtracted which corresponds to the number of bytes that each of the bytes was shifted in the history buffer 212. For instance, in this example each of the bytes was shifted by eight bytes to make room for the new sequence 604. Therefore, each location described by the plurality of hash chains 310(1)-310(K) has "8" subtracted from the location to reflect the new location of the corresponding index 308(k) in the history buffer 212. To remove locations from each of the hash chains 310(k) that are no longer included in the history buffer 212, any location having a value less than zero is removed from the hash chains 310(k).

Figure 7:
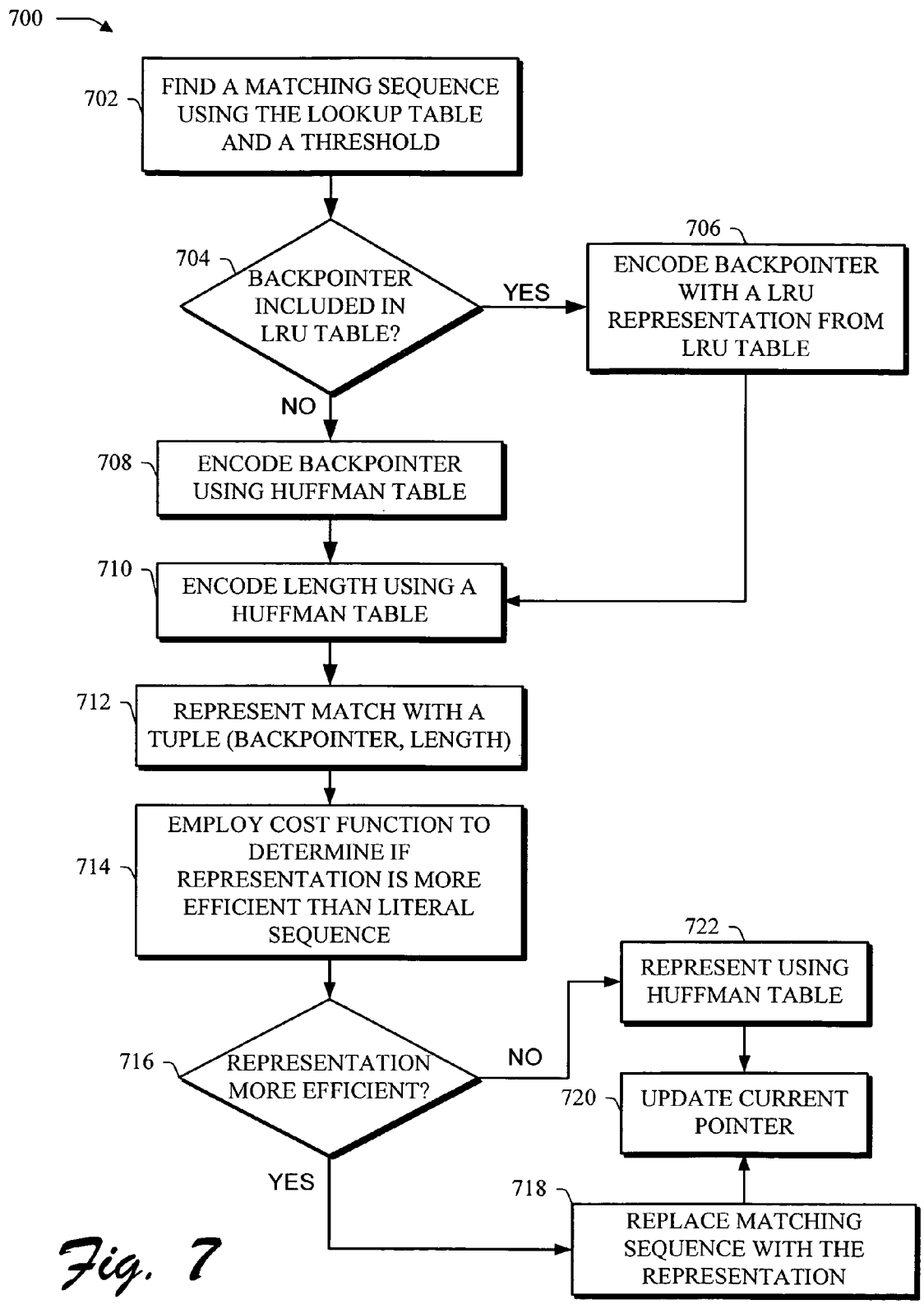
FIG. 7 is a flow chart depicting a procedure in an exemplary implementation in which compression of streaming data is further optimized.

FIG. 7 is a flow chart depicting a procedure 700 in an exemplary implementation in which compression of streaming data is further optimized. In the previous procedures 300, 400 that were discussed in relation to FIGS. 3-4, the lookup table 216 was configured to describe each location in the history buffer 212 of a corresponding index 308(k) to efficiently locate an initial sequence in the history buffer 212. Finding a matching sequence in the history buffer 212 may be further optimized to further improve the efficiency of data compression.

At block 702, for example, a matching sequence in found using the lookup table and employing a threshold. A variety of thresholds may be employed. For instance, a comparison to find the matching sequence may be performed at a predetermined number of locations in the history buffer to limit the number of comparisons that are performed. By limiting the number of locations in the history buffer that are compared with the data to be streamed, the size (e.g., number of bytes) of the location may be limited. For example, as previously described the location of a matching sequence in the history buffer 212 may be described as a relative location between the beginning or end of the matching sequence to the beginning or end of the current pointer, which may be described via a backpointer. Therefore, by limiting the number of comparisons that are performed, the greater the likelihood that the matching sequence will be located "closer" to the current pointer. Thus, the location may have a smaller value, e.g. utilize fewer bytes, due to this "closeness". In another implementation, a threshold may be employed such that locations that have values above a predetermined threshold are not considered, which again may serve to limit the size of a value for the location. Thus a variety of thresholds may be employed, such as a number of locations to be searched, a size of a value that describes each location, a size of a value that describes the length of each located sequence, and so on.

At decision block 704, a determination is made as to whether the backpointer which describes the location of the matching sequence is included in a last recently used (LRU) table. The LRU table may be utilized to store the last recently used backpointers. If the backpointer for the matching sequence is included in the LRU table, a LRU representation that corresponds to the backpointer in the LRU table is used to encode the backpointer for the matching sequence. For example, the LRU table may have a depth of four such that the last four recently used backpointers are stored in the LRU table. Each of the backpointers in the LRU has a corresponding LRU representation that maps to the LRU table. Therefore, if the backpointer is included in the LRU table, then at block 706, the backpointer may be encoded with the LRU representation from the LRU table. In this way, the compression module may address additional patterns that may be encountered in steaming data to further compress the data. For instance, graphical data that is streamed from the server to the client may include matching sequences that are repeated at similar offsets in the history buffer. Therefore, the matching sequence may be compressed utilizing a representation that includes the length and the location of the matching sequence, with the location being further compressed through use of the LRU representation.

If the backpointer is not included in the LRU table, then at block 708, the backpointer may be encoded using the Huffman table 228 of FIG. 2. Huffman encoding may start with a frequency of occurrences table that relates a frequency of occurrence of each backpointer that is to be further compressed. A variable length string is assigned to each backpointer that uniquely represents that backpointer. For example, each variable length string may have a unique prefix. The strings may then be arranged as a tree to encode and decode each backpointer and representation, respectively. To encode a backpointer, the backpointer is located in the tree. Branches of the tree that are utilized to locate the leaf that includes the backpointer are utilized to encode the byte sequence, i.e. provide a representation of the backpointer. For example, each branch of a tree utilized for Huffman encoding may be marked by a symbol of an output alphabet, e.g. bits 0 and 1, so that encoding is an enumeration of branch markings on a path from a root of the tree to the backpointer being encoded. Decoding each representation is performed by following the tree from its origin down through the branches to the leaf of the tree based on each successive value in the string until a leaf of the tree is reached that includes the backpointer.

At block 710, the length of the matching sequence is also encoded using a Huffman table. For example, the Huffman table 230 of FIG. 2 may be utilized to encode the length of the matching sequence in the history buffer to further compress the data. The length may be encoded as was described for the backpointer.

At block 712, the matching sequence is represented by a representation configured as a tuple which includes the backpointer that describes the location of the matching sequence in the history buffer and the length of the matching sequence. At block 714, a cost function is employed to determine if the representation is more efficient, e.g. utilizes less memory resources when stored and/or less bandwidth when streamed, that the matching sequence. For example, in some instances the matching sequence may utilize fewer bytes than the representation which describes the location and the length of the matching sequence in the history buffer. Therefore, the cost function may be employed to determine whether the representation or the matching sequence, i.e. the literal sequence in the data, is more efficient. A variety of cost functions may be employed. For example, a cost function may utilize a product of the size of the backpointer and the length of the matching sequence.

At decision block 716, if the representation is more efficient, then at block 718 compressed data is formed by representing the matching sequence with the representation. At block 720, the current pointer is updated and the next initial sequence is processed. For example, the current pointer may be incremented by the length of the matching sequence and the procedure repeated for the next sequence in the data. Once the current pointer is incremented through the data for streaming, the compressed data is streamed to the client.

At decision block 716, if the representation is not more efficient, then at block 722 the matching sequence is represented utilizing a Huffman table as was previously described. At block 720, the current pointer is incremented by the number of bytes in the matching sequence and the procedure continues for the next sequence.

As previously described, the Huffman table may further compress the data to be streamed. Three Huffman tables have been described to encode backpointers, lengths and literal sequences, respectively. In another implementation, the Huffman tables may be combined. For example, as shown in FIG. 2, Huffman table 228 may be utilized to encode literal 232 byte sequences and backpointers 234. To distinguish backpointers and literal sequences inside a compressed stream, the backpointers and the literal sequences may be provided with respective unique prefixes, e.g. each backpointers starts with bit "0" and each literal sequence starts with bit "1". In another implementation, unified index code may be utilized to encode both literal sequences and backpointers by combining them both into a single alphabet so that the backpointers and literal sequences have different respective characters.

Encoding tables, such as the Huffman tables previously described, may be provided in a variety of ways. For example, in one implementation the encoding tables are preconfigured for use by the compression and decompression modules so that the encoding tables need not be computed for each packet of data to be streamed. This may be utilized to increase the speed of the encryption process. In another implementation, the encoding tables are dynamically computed at predetermined intervals. For example, the encoding tables may be recomputed every time a pre-determined number of packets are received to update the encoding tables.

Figure 8:
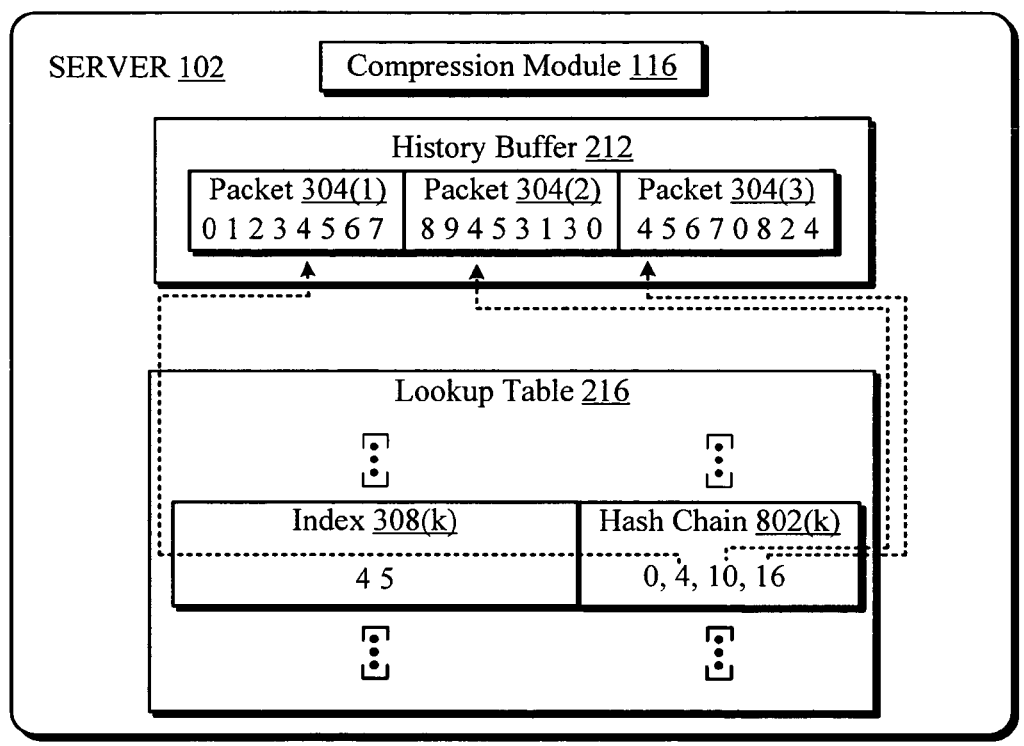
FIG. 8 is an illustration of an exemplary implementation in which comparison of sequences is optimized to further optimize data compression.

FIG. 8 is an illustration of an exemplary implementation 800 in which comparison of sequences is optimized to further optimize data compression. As before, the server 102 includes the history buffer 212 and the lookup table 216. The server 102 executes the compression module 116 to compress packet 304(3). An offset from the beginning of history buffer 212 to the beginning of a rightmost sequence in which the first two bytes are the same may be represented as i1=HASH [HASH_SUM(s)]. In the illustrated example, "s" is equal to "4 5" and i1=10 when counting from the beginning of the history buffer 212 and starting at zero. A next offset from the beginning of the history buffer 212 to a next rightmost sequence may be represented as i2=NEXT[i1]. In the illustrated example shown in FIG. 8, i2=NEXT[10]=4 in the hash chain 802(k). Likewise, each successive offset from the beginning of the history buffer 212 may be represented in the hash chain 802(k), such as i3=NEXT[i2]. In the illustrated example, i3=zero because there is no other sequence in the history buffer 212 that includes "4 5".

The compression module 116, when executed, may then initiate a procedure to compress packet 304(3) starting from "4 5" at position 16 in history buffer 212. The compression module 116 may first locate a sequence in the history buffer 212 having the initial sequence "4 5" from location i1=HASH [HASH_SUM ('4', '5')]=10 of the hash chain 802(k). The location is stored and NEXT[16] is set to 10 and HASH [HASH_SUM ('4', '5')] is set to 16. Sequences are compared at current position (16) and position i1 (10), one to another, by first comparing a next sequential byte is the respective sequences. In this instance the third byte in packet 304(3) is compared with the fifth byte in packet 304(2) to find a match. In the illustrated example, the next sequential byte (i.e. the third byte in the respective sequences) are different since HISTORY[10+3]='3' and HISTORY[16+3]='6'. Therefore, the length of the prospective matching sequence remains at 2 and the position of the prospective matching sequence remains at 10.

The compression module 116 may then locate a next sequence in the history buffer 212 at location i2=NEXT[i1]=4 from the lookup table 216. Because i2 does not equal zero, i.e. there is match of at least two bytes. The next sequential bytes following the respective bytes "4 5" are compared as before, which results in a match of 4 bytes. Therefore, the length of the prospective matching sequence is set at 4 and the position of the prospective matching sequence is set at 4. The compression module 116 may then locate another sequence in the history buffer 212 at location i3=NEXT[i2]=0 from the hash chain 802(k). Because i3 equals zero, it is the end of the hash chain 802(k), and no other locations are compared. It should be noted that the compression module 116, in an implementation, does not check for an end of the hash chain 802(k), specifically. Instead, sequences at position "i0" (16 in the illustrated example of FIG. 8), NEXT[0] are set equal to i0. Therefore, when the end of the hash chain 802(k) (iN=NEXT [i{N−1 }]=0) is reached, it is checked and the compression module 116 proceeds to i{N+l}=NEXT[iN]=i0.

By comparing the "next" sequential bytes after the prospective matching sequence length, the speed of the comparison may be improved. In the previous example, for instance, HISTORY[i0+MatchLength] was compared with HISTORY [i0+MatchLength]. When there are no other sequences in the history buffer 212 for comparison, a comparison of the full sequence at each respective location is then performed. In other words, each byte is compared, one to another, in the respective sequences at the respective locations in the history buffer 212. If the full sequence comparison is successful, the matching sequence is derived. In this way, a measurable speed-up in the comparison of sequences in the history buffer 212 may be obtained.

Figure 9:
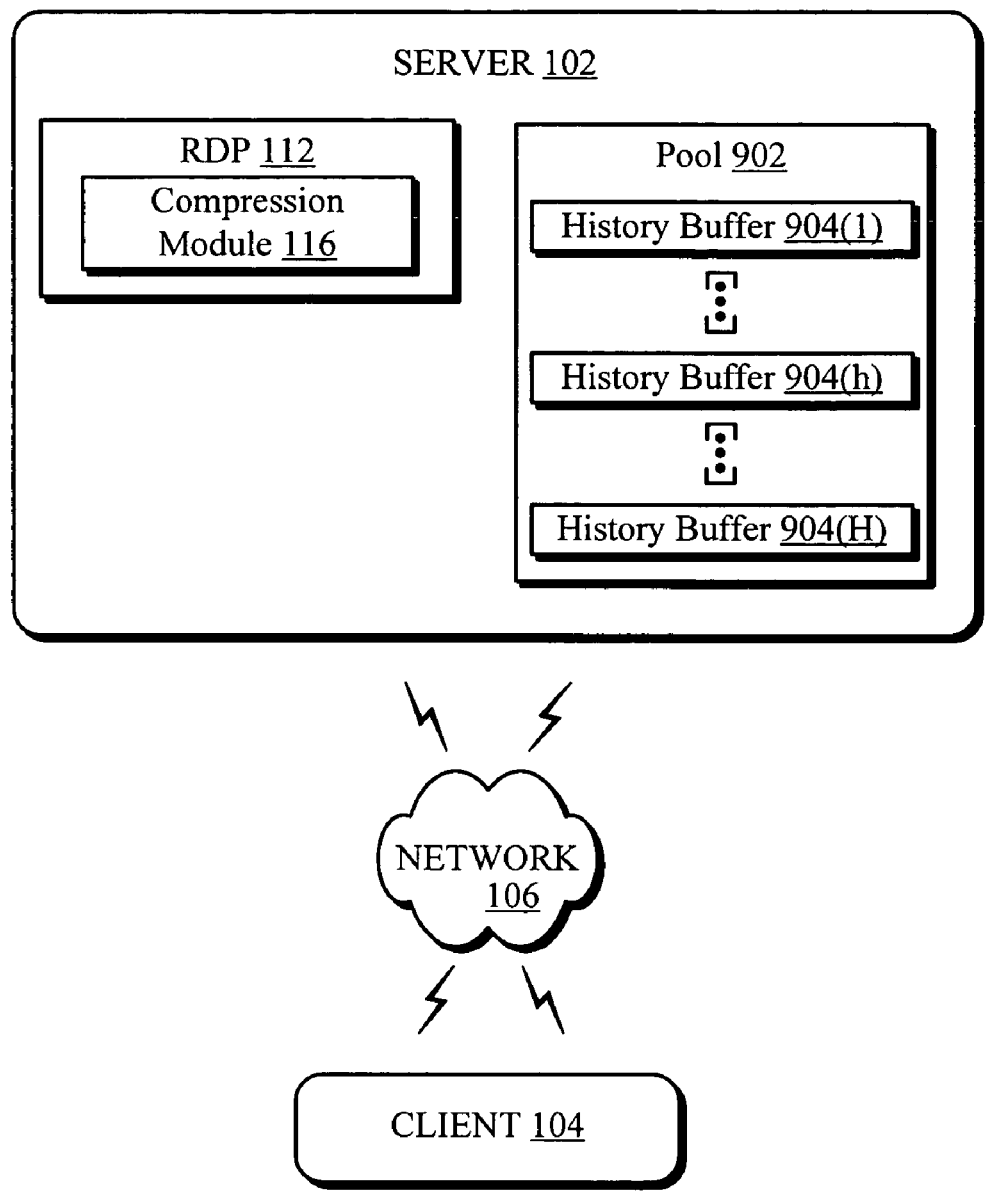
FIG. 9 is an illustration of a system in an exemplary implementation in which compression is dynamically tuned in response to feedback received from the system.

FIG. 9 is an illustration of a system 900 in an exemplary implementation in which compression is dynamically tuned in response to feedback received from the system. Communication between the server 102 and the client 104 over the network may vary due to a wide variety of factors. For example, the client 104 may have limited software and/or hardware resources such that it takes the client 104 longer to decompress data than it takes the server 102 to compress it. In another example, the server 102 may supply data to multiple clients, and therefore the clients may decompress the data faster than the server 102 can compress data for each of the clients. By tuning one or more of the compression parameters that were previously described, communication between the server 102 and the client 104 may be optimized such that it takes into account the hardware and/or software resources of the server 102 and client 104 as well as the resources of network 106 that communicatively couples them. For example, if the server 102 is "waiting" to send compressed data to the client 104, the server 102 may perform additional compression computations to further compress the data.

To tune the parameters of the compression module 116 of the RDP 112, feedback is obtained. A variety of factors may be used as feedback to tune the compression parameters, such as general network characteristics. For example, information from a network layer which indicates that there is network backpressure due to a slow link may be utilized by the compression module 116 to indicate that there is additional time to further compress the data. Therefore, the compression module 116 can be dynamically tuned to spend more time compressing the data to bring the final output size down when there is backpressure.

In another example, the RDP 112 may utilize a fixed pool 902 of history buffers 904(1), . . . , 904(h), . . . , 904(H). Upper layers that want to send data operate by requesting (allocating) a buffer (e.g., buffer 904(h)) from the pool 902, filling the buffer 904(h) with data (which includes compressing the data), and then transmitting the compressed data to the client 104. The buffer 904(h) is only returned to the pool 902, i.e. "freed", when the contents of the buffer have been transmitted. This technique allows the RDP 112, and more particularly the compression module 116, to obtain feedback, i.e. backpressure information, as to whether there is a slow or fast network connection (e.g., amount of bandwidth), a slow or fast client (e.g., amount of time taken by the client to decompress data), and so on, based on how long it takes to 'release' a buffer back to the buffer pool.

In yet another example, if none of the buffers 904(1)-904 (H) of the pool 902 are available, the compression module 116 may be adapted to "work harder" by tuning the various compression thresholds to spend more time on compression. Once the network conditions improve, the compression module 116 may also be tuned to perform fewer compression operations so that the data is sent out more quickly. For example, if the network 106 has a considerable amount of available bandwidth, then the number of compression operations that is performed may be reduced because the compression is not needed to lower the amount of time it takes to communicate the data. In this way, a dynamic technique may be employed such that compression parameters are changed at runtime based on fluctuating network conditions. In another implementation, an initial measurement of the network speed it utilized to tune the parameters, which are then utilized throughout the session.

As previously stated, factors used to tune the compression module 116 may also take into account the hardware and/or software resources of the server 102. For example, load on the server 102 may be taken into account (e.g., how many active sessions are being provided by the server 102, load on the processor 202 of FIG. 2, and so on) and dynamically tune the compression strength to compensate by using less CPU on compression. An example of a compression parameter that may be tuned is search window size. For instance, the search window size may be tuned from 64K to 512K. A larger window may offer more relative compression but may be slower to implement. Therefore, it may be advantageous to 'switch' to a large window if the network is deemed to be slow.

Another example of a factor used to tune the compression module 116 is the number of links in the hash chain that are traversed to look for matches may be tuned. For instance, walking longer chain links may increase the probability of finding longer matches, but may cost additional hardware and/or software resources to perform the matching.

A further example of a factor used to tune the compression module 116 is a threshold that specifies a longest match found for terminating a search. As previously described, the threshold may be utilized to limit the amount of searching that is performed to find a match. The larger this threshold the greater the probability of finding a longer match and thereby further compressing the data. However, a greater amount of processing resources may also be utilized when performing this search. Although a variety of factors and parameters have been discussed, a variety of other factors and parameters may also be utilized as described therein.

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. A method of streaming data over a network from a first device to a second device, the method comprising:
   compressing the data at the first device by finding an index in a lookup table that matches an initial sequence in the data, the lookup table comprising a plurality of entries, each said entry being discoverable utilizing a particular one of a plurality of said indices, each said entry referencing whether a corresponding said index is located in a history buffer, and if so, further references one or more locations of the corresponding said index in the history buffer;
   when the corresponding said entry of the matching index references a plurality of said locations:
      for each said location, comparing a sequence at the location having the matching index with a sequence in the data, said sequence including the initial sequence;
      deriving a matching sequence from the comparison based on at least one of a length and the location of the sequence at each said location;
      representing the matching sequence using a representation that includes the length and the location of the matching sequence in the history buffer;
   forming compressed data that includes at least one of said representations;
   further compressing the compressed data by encoding the at least one representation that includes the length and the location of the matching sequence, the at least one representation being encoded using a first Huffman table for encoding the length using Huffman encoding;
   using a last recently used (LRU) table for encoding the location of the matching sequence in the history buffer, the LRU table listing a plurality of recently used locations of recent matching sequences;
   when the location of the matching sequence is not in the LRU table, encoding the location of the matching sequence with Huffman encoding using a second Huffman table, different from the first Huffman table;
   using the second Huffman table to also compress literal sequences that have no matching index in the history buffer; and
   streaming the compressed data over the network to the second device.

2. A method as described in claim 1, wherein the forming compressed data includes finding one said index in the lookup table for each said sequence in the data.

3. A method as described in claim 1, wherein the corresponding said entry of the matching index references a hash chain which includes each said location of the matching index in the history buffer.

4. A method as described in claim 1, wherein the initial sequence and the index are each composed of at least two bytes.

5. A method as described in claim 1, wherein the data is formatted as one or more packets and the packets are compressed for streaming over the network so that the compressing is performed on a per-packet basis.

6. A method as described in claim 1, wherein the Huffman encoding for compressing the literal sequences uses a frequency of occurrences table generated from the data and a variable length string assigned as a prefix to each literal sequence for uniquely representing the literal sequence.

7. A method as described in claim 1, further comprising:
   determining that the corresponding said entry of the matching index references a single said location;
   comparing a sequence at the single said location having the matching index with the sequence in the data;
   deriving a matching sequence from the comparison based on at least one of a length and the location of the sequence at the single said location; and
   representing the matching sequence using a representation that includes the length and the single said location of the matching sequence in the history buffer; and
   when each said sequence of the data is represented or encoded, streaming the data having the encoding or the representation.

8. A method as described in claim 1, wherein the comparison to derive the matching sequence is performed utilizing one or more thresholds selected from the group consisting of:
   a number of said locations having the matching index to be compared;
   a size of a value that describes each said location having the matching index; and
   a size of a value that describes a length of the sequence at each said location that matches the sequence in the data that includes the matching index.

9. A method as described in claim 1, further comprising:
   representing the representation as a tuple that includes a backpointer that describes the location of the matching sequence in the history buffer and the length of the matching sequence;
   employing a cost function to determine if the representation utilizes less memory when stored than the matching sequence, wherein the cost function utilizes a product of a size of the backpointer and the length of the matching sequence; and
   when the representation utilizes less memory when stored than the matching sequence, forming compressed data that includes the representation.

10. A method as described in claim 1, further comprising determining whether the location of the matching sequence matches one of a plurality of locations in the LRU table, wherein:

each said location in the LRU table has a corresponding said LRU representation;

each said location in the LRU table describes one of a plurality of last recently used locations of sequences in previously streamed data; and if the location of the matching sequence is included in the LRU table, the location of the matching sequence is encoded with a corresponding said LRU representation from the LRU table.

11. One or more computer-readable storage media storing computer-executable instructions that, when executed, perform the method as recited in claim 1.

12. A method as described in claim 1, wherein:

the second device includes a client history buffer, a third Huffman table that includes codes for decoding locations of matching sequences and literal bytes, a fourth Huffman table that includes codes for decoding lengths of matching sequences, the LRU table, and a decompression module that is executable by the second device to decompress the streamed data; and when an encoded representation is present in the configured data, the decompression module is configured to decode the representation using the LRU table, the third Huffman table, and the fourth Huffman table, and find the matching sequence in the second said history buffer based on a decoded location and a decoded length indicated by the representation.

13. A computing device comprising:

one or more processors coupled to computer storage media; and a module, stored on the computer storage media and executed on the one or more processors, to perform the following operations:

compressing data at the computing device by finding an index in a lookup table that matches an initial sequence in the data, the lookup table comprising a plurality of entries, each said entry being discoverable utilizing a particular one of a plurality of said indices, each said entry referencing whether a corresponding said index is located in a history buffer, and if so, further references one or more locations of the corresponding said index in the history buffer;

when the corresponding said entry of the matching index references a plurality of said locations:

for each said location, comparing a sequence at the location having the matching index with a sequence in the data, said sequence including the initial sequence;

deriving a matching sequence from the comparison based on at least one of a length and the location of the sequence at each said location;

representing the matching sequence using a representation that includes the length and the location of the matching sequence in the history buffer;

forming compressed data that includes at least one of said representations;

further compressing the compressed data by encoding the at least one representation that includes the length and the location of the matching sequence, the at least one representation being encoded using a first Huffman table for encoding the length using Huffman encoding;

using a last recently used (LRU) table for encoding the location of the matching sequence in the history buffer, the LRU table listing a plurality of recently used locations of recent matching sequences;

when the location of the matching sequence is not in the LRU table, encoding the location of the matching sequence with Huffman encoding using a second Huffman table, different from the first Huffman table;

using the second Huffman table to also compress literal sequences that have no matching index in the history buffer; and streaming the compressed data over a network to another computing device.

14. The computing device as described in claim 13, wherein the forming compressed data includes finding one said index in the lookup table for each said sequence in the data.

15. The computing device as described in claim 13, wherein the corresponding said entry of the matching index references a hash chain which includes each said location of the matching index in the history buffer.

16. The computing device as described in claim 13, wherein the initial sequence and the index are each composed of at least two bytes.

17. The computing device as described in claim 13, wherein the data is formatted as one or more packets and the packets are compressed for streaming over the network so that the compressing is performed on a per-packet basis.

18. The computing device as described in claim 13, wherein the Huffman encoding for compressing the literal sequences uses a frequency of occurrences table generated from the data and a variable length string assigned as a prefix to each literal sequence for uniquely representing the literal sequence.

19. The computing device as described in claim 13, the operations further comprising:

determining that the corresponding said entry of the matching index references a single said location;

comparing a sequence at the single said location having the matching index with the sequence in the data;

deriving a matching sequence from the comparison based on at least one of a length and the location of the sequence at the single said location;

representing the matching sequence using a representation that includes the length and the single said location of the matching sequence in the history buffer; and when each said sequence of the data is represented or encoded, streaming the data having the encoding or the representation.

20. The computing device as described in claim 13, wherein the comparison to derive the matching sequence is performed utilizing one or more thresholds selected from the group consisting of:

a number of said locations having the matching index to be compared;

a size of a value that describes each said location having the matching index; and a size of a value that describes a length of the sequence at each said location that matches the sequence in the data that includes the matching index.

21. The computing device as described in claim 13, the operations further comprising:

representing the representation as a tuple that includes a backpointer that describes the location of the matching sequence in the history buffer and the length of the matching sequence;

employing a cost function to determine if the representation utilizes less memory when stored than the matching sequence, wherein the cost function utilizes a product of a size of the backpointer and the length of the matching sequence; and when the representation utilizes less memory when stored than the matching sequence, forming compressed data that includes the representation.

22. The computing device as described in claim 13, the operations further comprising determining whether the location of the matching sequence matches one of a plurality of locations in the LRU table, wherein:

each said location in the LRU table has a corresponding said LRU representation;

each said location in the LRU table describes one of a plurality of last recently used locations of sequences in previously streamed data; and if the location of the matching sequence is included in the LRU table, the location of the matching sequence is encoded with a corresponding said LRU representation from the LRU table.

23. The computing device as described in claim 13, wherein:

the other computing device includes a client history buffer, a third Huffman table that includes codes for decoding locations of matching sequences and literal bytes, a fourth Huffman table that includes codes for decoding lengths of matching sequences, the LRU table, and a decompression module that is executable by the other computing device to decompress the streamed data; and when an encoded representation is present in the configured data, the decompression module is configured to decode the representation using the LRU table, the third Huffman table, and the fourth Huffman table, and find the matching sequence in the second said history buffer based on a decoded location and a decoded length indicated by the representation.

24. Computer storage media, wherein the media is not a signal, having executable instructions stored thereon, the instructions, when executed by one or more processors, implementing a module to perform the following operations:

compressing data at a first computing device by finding an index in a lookup table that matches an initial sequence in the data, the lookup table comprising a plurality of entries, each said entry being discoverable utilizing a particular one of a plurality of said indices, each said entry referencing whether a corresponding said index is located in a history buffer, and if so, further references one or more locations of the corresponding said index in the history buffer;

when the corresponding said entry of the matching index references a plurality of said locations:

for each said location, comparing a sequence at the location having the matching index with a sequence in the data, said sequence including the initial sequence;

deriving a matching sequence from the comparison based on at least one of a length and the location of the sequence at each said location;

representing the matching sequence using a representation that includes the length and the location of the matching sequence in the history buffer;

forming compressed data that includes at least one of said representations;

further compressing the compressed data by encoding the at least one representation that includes the length and the location of the matching sequence, the at least one representation being encoded using a first Huffman table for encoding the length using Huffman encoding;

using a last recently used (LRU) table for encoding the location of the matching sequence in the history buffer, the LRU table listing a plurality of recently used locations of recent matching sequences;

when the location of the matching sequence is not in the LRU table, encoding the location of the matching sequence with Huffman encoding using a second Huffman table, different from the first Huffman table;

using the second Huffman table to also compress literal sequences that have no matching index in the history buffer; and streaming the compressed data over a network to a second computing device.

25. The computer storage media as described in claim 24, wherein the forming compressed data includes finding one said index in the lookup table for each said sequence in the data.

26. The computer storage media as described in claim 24, wherein the corresponding said entry of the matching index references a hash chain which includes each said location of the matching index in the history buffer.

27. The computer storage media as described in claim 24, wherein the initial sequence and the index are each composed of at least two bytes.

28. The computer storage media as described in claim 24, wherein the data is formatted as one or more packets and the packets are compressed for streaming over the network so that the compressing is performed on a per-packet basis.

29. The computer storage media as described in claim 24, wherein the Huffman encoding for compressing the literal sequences uses a frequency of occurrences table generated from the data and a variable length string assigned as a prefix to each literal sequence for uniquely representing the literal sequence.

30. The computer storage media as described in claim 24, the operations further comprising:

determining that the corresponding said entry of the matching index references a single said location;

comparing a sequence at the single said location having the matching index with the sequence in the data;

deriving a matching sequence from the comparison based on at least one of a length and the location of the sequence at the single said location;

representing the matching sequence using a representation that includes the length and the single said location of the matching sequence in the history buffer; and when each said sequence of the data is represented or encoded, streaming the data having the encoding or the representation.

31. The computer storage media as described in claim 24, wherein the comparison to derive the matching sequence is performed utilizing one or more thresholds selected from the group consisting of:

a number of said locations having the matching index to be compared;

a size of a value that describes each said location having the matching index; and a size of a value that describes a length of the sequence at each said location that matches the sequence in the data that includes the matching index.

32. The computer storage media as described in claim 24, the operations further comprising:

representing the representation as a tuple that includes a backpointer that describes the location of the matching sequence in the history buffer and the length of the matching sequence;

employing a cost function to determine if the representation utilizes less memory when stored than the matching sequence, wherein the cost function utilizes a product of a size of the backpointer and the length of the matching sequence; and when the representation utilizes less memory when stored than the matching sequence, forming compressed data that includes the representation.

33. The computer storage media as described in claim 24, the operations further comprising determining whether the location of the matching sequence matches one of a plurality of locations in the LRU table, wherein:

each said location in the LRU table has a corresponding said LRU representation;

each said location in the LRU table describes one of a plurality of last recently used locations of sequences in previously streamed data; and if the location of the matching sequence is included in the LRU table, the location of the matching sequence is encoded with a corresponding said LRU representation from the LRU table.

34. The computer storage media as described in claim 24, wherein:

the second computing device includes a client history buffer, a third Huffman table that includes codes for decoding locations of matching sequences and literal bytes, a fourth Huffman table that includes codes for decoding lengths of matching sequences, the LRU table, and a decompression module that is executable by the second computing device to decompress the streamed data; and when an encoded representation is present in the configured data, the decompression module is configured to decode the representation using the LRU table, the third Huffman table, and the fourth Huffman table, and find the matching sequence in the second said history buffer based on a decoded location and a decoded length indicated by the representation.

35. A method of streaming data over a network from a first device to a second device, the method comprising:

compressing the data at the first device by finding an index in a lookup table that matches an initial sequence in the data, the lookup table comprising a plurality of entries, each said entry being discoverable utilizing a particular one of a plurality of said indices, each said entry referencing whether a corresponding said index is located in a history buffer, and if so, further references one or more locations of the corresponding said index in the history buffer;

when the corresponding said entry of the matching index references a plurality of said locations:

for each said location, comparing a sequence at the location having the matching index with a sequence in the data, said sequence including the initial sequence;

deriving a matching sequence from the comparison based on at least one of a length and the location of the sequence at each said location;

representing the matching sequence using a representation that includes the length and the location of the matching sequence in the history buffer;

forming compressed data that includes at least one of said representations, wherein forming the compressed data includes finding one said index in the lookup table for each said sequence in the data;

further compressing the compressed data by encoding the at least one representation that includes the length and the location of the matching sequence, the at least one representation being encoded using a first Huffman table for encoding the length using Huffman encoding;

using a last recently used (LRU) table for encoding the location of the matching sequence in the history buffer, the LRU table listing a plurality of recently used locations of recent matching sequences;

when the location of the matching sequence is not in the LRU table, encoding the location of the matching sequence with Huffman encoding using a second Huffman table, different from the first Huffman table;

using the second Huffman table to also compress literal sequences that have no matching index in the history buffer, the Huffman encoding using a frequency of occurrences table generated from the data and a variable length string assigned as a prefix to each literal sequence for uniquely representing the literal sequence; and streaming the compressed data over the network to the second device.

36. The method as described in claim 35, wherein the corresponding said entry of the matching index references a hash chain which includes each said location of the matching index in the history buffer.

37. The method as described in claim 35, wherein the initial sequence and the index are each composed of at least two bytes.

38. The method as described in claim 35, wherein the data is formatted as one or more packets and the packets are compressed for streaming over the network so that the compressing is performed on a per-packet basis.

39. The method as described in claim 35, further comprising:

determining that the corresponding said entry of the matching index references a single said location;

comparing a sequence at the single said location having the matching index with the sequence in the data;

deriving a matching sequence from the comparison based on at least one of a length and the location of the sequence at the single said location;

representing the matching sequence using a representation that includes the length and the single said location of the matching sequence in the history buffer; and when each said sequence of the data is represented or encoded, streaming the data having the encoding or the representation.

40. The method as described in claim 35, wherein the comparison to derive the matching sequence is performed utilizing one or more thresholds selected from the group consisting of:

a number of said locations having the matching index to be compared;

a size of a value that describes each said location having the matching index; and a size of a value that describes a length of the sequence at each said location that matches the sequence in the data that includes the matching index.

41. The method as described in claim 35, further comprising:

representing the representation as a tuple that includes a backpointer that describes the location of the matching sequence in the history buffer and the length of the matching sequence;

employing a cost function to determine if the representation utilizes less memory when stored than the matching sequence, wherein the cost function utilizes a product of a size of the backpointer and the length of the matching sequence; and when the representation utilizes less memory when stored than the matching sequence, forming compressed data that includes the representation.

42. The method as described in claim 35, further comprising determining whether the location of the matching sequence matches one of a plurality of locations in the LRU table, wherein:
   each said location in the LRU table has a corresponding said LRU representation;
   each said location in the LRU table describes one of a plurality of last recently used locations of sequences in previously streamed data; and
   if the location of the matching sequence is included in the LRU table, the location of the matching sequence is encoded with a corresponding said LRU representation from the LRU table.

43. The method as described in claim 35, wherein:
the second device includes a client history buffer, a third Huffman table that includes codes for decoding locations of matching sequences and literal bytes, a fourth Huffman table that includes codes for decoding lengths of matching sequences, the LRU table, and a decompression module that is executable by the second device to decompress the streamed data; and when an encoded representation is present in the configured data, the decompression module is configured to decode the representation using the LRU table, the third Huffman table, and the fourth Huffman table, and find the matching sequence in the second said history buffer based on a decoded location and a decoded length indicated by the representation.

\* \* \* \* \*

UNITED STATES PATENT AND TRADEMARK OFFICE
CERTIFICATE OF CORRECTION

| | | |
|---|---|---|
| PATENT NO. | : 7,966,424 B2 | Page 1 of 1 |
| APPLICATION NO. | : 10/801329 | |
| DATED | : June 21, 2011 | |
| INVENTOR(S) | : Nadim Y. Abdo et al. | |

It is certified that error appears in the above-identified patent and that said Letters Patent is hereby corrected as shown below:

In column 6, line 8, delete "media." and insert -- media, --, therefor.

In column 6, line 13, delete "media." and insert -- media, --, therefor.

Signed and Sealed this
Twenty-third Day of August, 2011

David J. Kappos
*Director of the United States Patent and Trademark Office*